United States Patent
Okuda et al.

(10) Patent No.: US 6,519,838 B1
(45) Date of Patent: Feb. 18, 2003

(54) COMPONENT MOUNTING APPARATUS

(75) Inventors: Osamu Okuda, Hirakata (JP); Hiroshi Uchiyama, Kofu (JP); Hiroshi Furuya, Yamanashi-ken (JP); Yoshihiro Mimura, Izumi (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/515,498

(22) Filed: Feb. 29, 2000

Related U.S. Application Data

(62) Division of application No. 08/917,370, filed on Aug. 26, 1997, now abandoned.

(30) Foreign Application Priority Data

Aug. 27, 1996 (JP) .............................................. 8-225088

(51) Int. Cl.$^7$ ................................................. B23P 19/00
(52) U.S. Cl. ............................ 29/740; 29/741; 29/759; 29/833; 29/720; 29/721
(58) Field of Search ........................ 29/740, 759, 832, 29/760, 833, 834, 846, 720, 721, 712; 298/68.2, 2; 414/277, 280

(56) References Cited

U.S. PATENT DOCUMENTS

| | | | |
|---|---|---|---|
| 4,995,157 A | | 2/1991 | Hall |
| 5,172,468 A | * | 12/1992 | Tanaka et al. ................ 29/721 |
| 5,233,745 A | * | 8/1993 | Morita ........................ 29/705 |
| 5,249,356 A | * | 10/1993 | Okuda et al. ................ 29/833 |
| 5,314,223 A | | 5/1994 | Harper, Jr. et al. |
| 5,339,248 A | | 8/1994 | Fujiwara et al. |
| 5,379,514 A | * | 1/1995 | Okuda et al. ................ 29/833 |
| 5,443,534 A | | 8/1995 | Vinciarelli et al. |
| 5,560,100 A | | 10/1996 | Englert |
| 5,566,447 A | | 10/1996 | Sakurai |
| 5,619,328 A | * | 4/1997 | Sakurai ....................... 356/375 |
| 5,694,219 A | * | 12/1997 | Kim ............................ 356/375 |
| 5,727,311 A | | 3/1998 | Ida et al. |
| 5,864,944 A | | 2/1999 | Kashiwagi et al. |
| 5,894,657 A | * | 4/1999 | Kanayama ................... 29/740 |

FOREIGN PATENT DOCUMENTS

| | | | |
|---|---|---|---|
| JP | 4035095 | * 2/1992 | |
| JP | 04199600 | * 7/1992 | |
| JP | 06209190 | * 7/1994 | ................ 29/720 |
| JP | 10-163691 | * 6/1998 | |
| JP | 11-330768 | * 11/1999 | |
| JP | 11-330 786 | * 11/1999 | |

* cited by examiner

Primary Examiner—Carl J. Arbes
Assistant Examiner—Minh Trinh
(74) Attorney, Agent, or Firm—Wenderoth, Lind & Ponack, L.L.P.

(57) ABSTRACT

A component mounting apparatus includes a board transfer section for carrying in circuit boards to a component mounting position and carrying out the circuit board after component-mounting operation. A component feed section is provided for feeding, to a specified position, a component to be mounted onto the circuit board, and a component mounting section is provided for loading a suction nozzle matching the component to be mounted, sucking up the component from the component feed section and moving the component to the mounting position, and mounting the component on a specified site of the circuit board. A controller is provided for controlling operations of the individual sections is order to execute a productional operation of component-mounting onto the circuit boards. Also, a remaining-component discarding device performs an operation of discarding a component which remains at the suction nozzle during a time period following the component-mounting operation while the component mounting section is kept halted.

8 Claims, 5 Drawing Sheets

COMPONENT MOUNTING APPARATUS

This a divisional application of Ser. No. 08/917,370, filed Aug. 26, 1997 now abandoned.

BACKGROUND OF THE INVENTION

The present invention relates to a component mounting apparatus for mounting electronic components onto circuit boards.

Component mounting apparatuses for mounting electronic components onto boards to produce component-mounted boards are required to implement such stable operation as will prevent occurrences of apparatus faults due to operational errors of the apparatus or human errors or the like.

Arrangement of a prior art example of such component mounting apparatuses is shown in FIG. 5. This component mounting apparatus 40 comprises: a transfer section 42 for transferring to a specified position a circuit board 43 onto which components are to be mounted; a feed section 41 for feeding to a specified position a component 44 which is to be mounted onto the circuit board 43; an X-Y robot 47 equipped with a head 45 having a suction nozzle 49 for sucking up the component 44 from the feed section 41 and mounting it onto the circuit board 43 and with a board recognition camera 46 for the positioning of a mounting position; and a nozzle station 50 for storing a plurality of suction nozzles 49 corresponding to a plurality of components 44.

In this arrangement, the circuit board 43 is transferred to a specified mounting position by the transfer section 42. In order to load to the head 45 a suction nozzle 49 corresponding to the component 44 to be mounted, the X-Y robot 47 moves the head 45 to a location above the nozzle station 50, separates the currently loaded suction nozzle 49 from the head 45, and then loads to the head 45 a suction nozzle 49 matching the component 44 to be next mounted. Next, the X-Y robot 47 moves the board recognition camera 46 to a location above the circuit board 43 and measures a board mark 51 provided on the circuit board 43, thus accomplishing an operation of recognizing the mounting position. Subsequently, the X-Y robot 47 moves the head 45 to the feed section 41, sucks up the fed component 44 by the suction nozzle 49, and moves the head 45 to a location above the mounting position on the circuit board 43. In this operation, the suction posture in which the component 44 is sucked up by the suction nozzle 49 is recognized by a component recognition camera 52. Based on this component posture information, an operation of correcting the suction posture is performed, and the component 44 is mounted at specified position on the circuit board 43.

In production processes with the component mounting apparatus as described above, it can occur that the operation of the apparatus is stopped due to the state of the apparatus, mis-feedings of components, and the like. When the apparatus is restarted after such a temporary stop, there are some cases where an unmounted component remains stuck to the suction nozzle due to residual pressure of the vacuum of the suction nozzle. In this state as it is, if a switching operation of the suction nozzle is executed, the component would enter the pocket of the nozzle station, causing the apparatus to be damaged.

The suction nozzle for sucking up abnormal-shaped components or small-sized components such as connectors and transformers with less area of flat surfaces is more likely to suffer suction errors due to clogging with dust or the like, so that the maintenance of the suction nozzle needs to be exercised on demand. The operator would take out the suction nozzle from the apparatus and, after cleaning it, accommodate it to the apparatus. In this process, there may occur human errors such as mis-positioning in returning the suction nozzle. Because the suction nozzle is controlled by a controller that controls the operation of the component mounting apparatus, a mis-positioning in returning the nozzle by the operator would, in some cases, cause the component mounting apparatus to be damaged due to inconsistency with the controlling operation of the apparatus.

Besides the above disadvantages, the number of kinds of suction nozzles has been increasing with diversified components to be mounted so that frequent changeovers of suction nozzles are needed in the production of one circuit board. As a result, there has arisen a demand for a stable operation that ensures a reliable execution of the control of suction nozzles.

SUMMARY OF THE INVENTION

An object of the present invention is therefore to provide a component mounting apparatus which prevents occurrences of apparatus errors and human errors and thus performs stable working operation.

In accomplishing these and other aspects, according to a first aspect of the present invention, there is provided a component mounting apparatus comprising:

a board transfer section for carrying in one of circuit boards to a component mounting position and carrying out the circuit board after component-mounting;

a component feed section for feeding to a specified position a component to be mounted onto the circuit board;

a component mounting section for loading a suction nozzle matching the component to be mounted, sucking up the component from the component feed section and moving the component to the mounting position, and mounting the component to a specified site of the circuit board;

a controller for controlling operations of the individual sections to execute a productional operation of component-mounting onto the circuit boards; and a remaining-component discarding device for performing an operation of discarding a component which remains at the suction nozzle during a time period for which the component-mounting operation by the component mounting section is kept halted.

According to a second aspect of the present invention, there is provided a component mounting apparatus according to the first aspect, wherein the component mounting section selects the suction nozzle matching the component to be mounted, from among a plurality of suction nozzles, and loads the suction nozzle.

According to a third aspect of the present invention, there is provided a component mounting apparatus comprising:

a board transfer section for carrying in one of circuit boards to a component mounting position and carrying out the circuit board after component-mounting;

a component feed section for feeding to a specified position a component to be mounted onto the circuit board;

a component mounting section for selecting and loading a suction nozzle matching the component to be mounted, from among a plurality of suction nozzles, sucking up the component from the component feed section and moving the component to the mounting position, and mounting the component to a specified site of the circuit board;

a controller for controlling operations of the individual sections to execute a productional operation of component-mounting onto the circuit boards; and a nozzle identifying device for performing an operation of identifying the suction nozzle during a time period for which the component-mounting operation by the component mounting section is kept halted.

According to a fourth aspect of the present invention, there is provided a component mounting apparatus comprising:

a board transfer section for carrying in one of circuit boards to a component mounting position and carrying out the circuit board after component-mounting;

a component feed section for feeding to a specified position a component to be mounted onto the circuit board; and a component mounting section for selecting and loading a suction nozzle matching the component to be mounted, from among a plurality of suction nozzles, sucking up the component from the component feed section and moving the component to the mounting position, and mounting the component to a specified site of the circuit board;

a controller for controlling operations of the individual sections to execute a productional operation of component-mounting onto the circuit boards;

a remaining-component discarding device for performing an operation of discarding a component which remains at the suction nozzle during a time period for which the component-mounting operation by the component mounting section is kept halted; and a nozzle identifying device for performing an operation of identifying the suction nozzle during a time period for which the component mounting operation by the component mounting section is kept halted.

According to a fifth aspect of the present invention, there is provided a component mounting apparatus according to the first aspect, wherein the time period for which the component mounting operation is kept halted is a time elapse since the circuit board after the component mounting is carried in by the board transfer section until a next circuit board is carried in to the mounting position.

According to a sixth aspect of the present invention, there is provided a component mounting apparatus according to the second aspect, wherein the time period for which the component mounting operation is kept halted is a time elapse since the circuit board after the component mounting is carried in by the board transfer section until a next circuit board is carried in to the mounting position.

According to a seventh aspect of the present invention, there is provided a component mounting apparatus according to the third aspect, wherein the time period for which the component mounting operation is kept halted is a time elapse since the circuit board after the component mounting is carried in by the board transfer section until a next circuit board is carried in to the mounting position.

According to an eighth aspect of the present invention, there is provided a component mounting apparatus according to the fourth aspect, wherein the time period for which the component mounting operation is kept halted is a time elapse since the circuit board after the component mounting is carried in by the board transfer section until a next circuit board is carried in to the mounting position.

According to a ninth aspect of the present invention, there is provided a component mounting apparatus according to the third aspect, wherein the identifying operation by the nozzle identifying device is an identification as to whether or not a suction nozzle has been loaded to a specified position.

According to a tenth aspect of the present invention, there is provided a component mounting apparatus according to the fourth aspect, wherein the identifying operation by the nozzle identifying device is an identification as to whether or not a suction nozzle has been loaded to a specified position.

According to an eleventh aspect of the present invention, there is provided a component mounting apparatus according to the third aspect, wherein the identifying operation by the nozzle identifying device is an operation for identifying a coincidence between the loaded suction nozzle and control data.

According to a twelfth aspect of the present invention, there is provided a component mounting apparatus according to the fourth aspect, wherein the identifying operation by the nozzle identifying device is an operation for identifying a coincidence between the loaded suction nozzle and control data.

According to the first and second aspects, during a time period in which the suction nozzle is out of the component mounting operation, a component remaining at the suction nozzle by vacuum residual pressure is discarded by the remaining-component discarding device. Thus, any errors of the apparatus operation as well as faults due to remaining components can be prevented from occurring. Also, performing the discarding operation by the exhaust of compressed air allows dust and the like sticking to the suction nozzle to be removed.

According to the third aspect, during a time period in which the suction nozzle is out of the component mounting operation, the presence or absence and kind of a loaded suction nozzle is identified by the nozzle identifying device. Thus, any errors of the apparatus operation as well as faults due to some errors of the operator or the like can be prevented from occurring.

According to the fourth aspect, during a time period in which the suction nozzle is out of the component mounting operation, a component remaining at the suction nozzle by vacuum residual pressure is discarded by the remaining-component discarding device. Thus, any errors of the apparatus operation as well as faults due to remaining components can be prevented from occurring. Also, performing the discarding operation by the exhaust of compressed air allows dust and the like sticking to the suction nozzle to be removed. Furthermore, by performing the identification of presence or absence as well as the kind of a loaded suction nozzle by the nozzle identifying device, any errors of the apparatus operation as well as faults due to some errors of the operator and the like can be prevented from occurring.

According to the aspects, the time period for carrying in and out circuit boards is a time period for which the mounting operation is kept halted. By performing the aforementioned individual operations during this time period, the operations of clearing and identifying the suction nozzle can be achieved.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
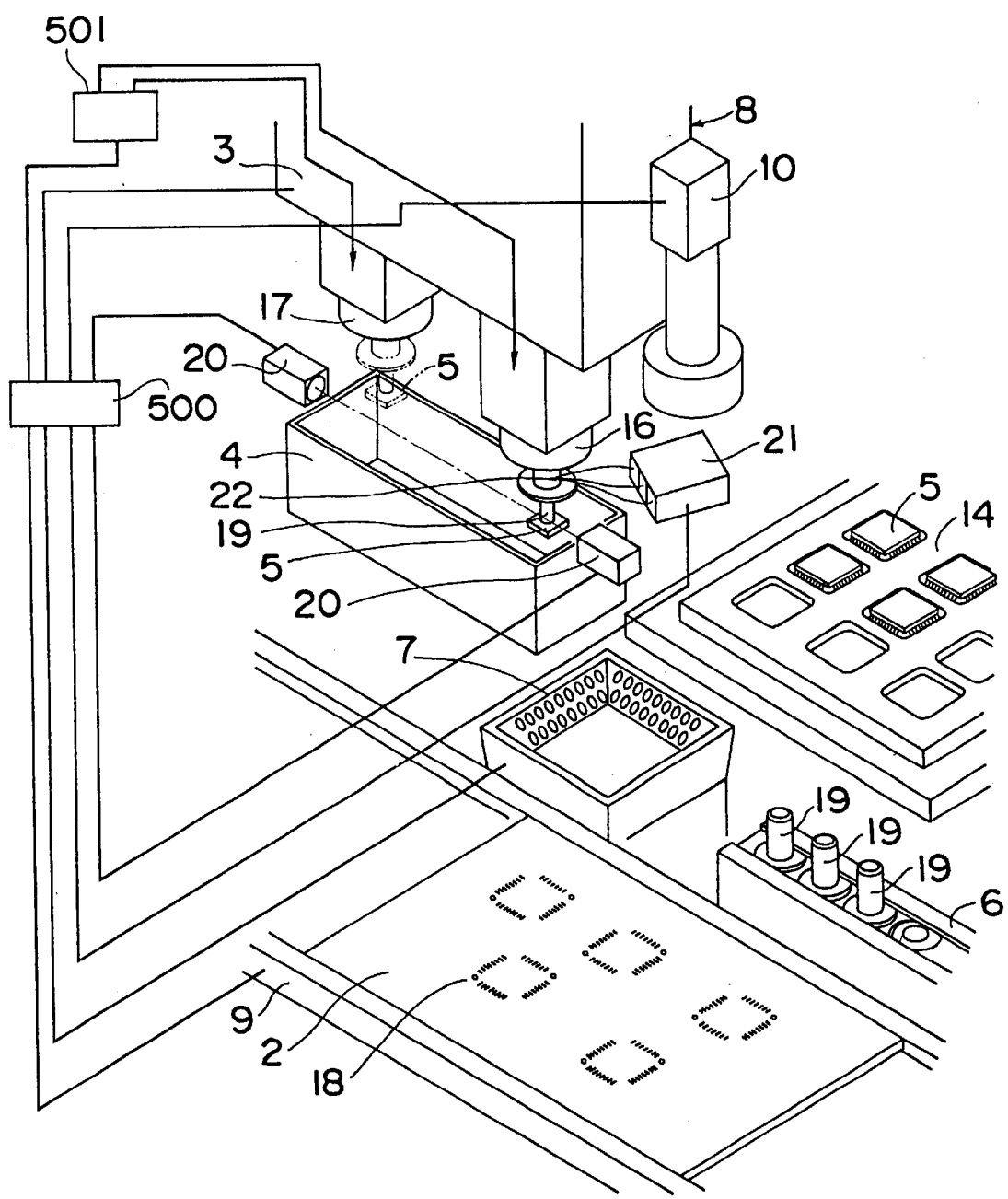
FIG. 1 is a perspective view showing a partial arrangement of a component mounting apparatus according to one embodiment of the present invention.

Before the description of the present invention proceeds, it is to be noted that like parts are designated by like reference numerals throughout the accompanying drawings.

Hereinbelow, one embodiment of the present invention is described with reference to the accompanying drawings for an understanding of the present invention. The embodiment below is only an example of the present invention, and should not be construed as limiting the technical scope of the present invention.

Figure 2:
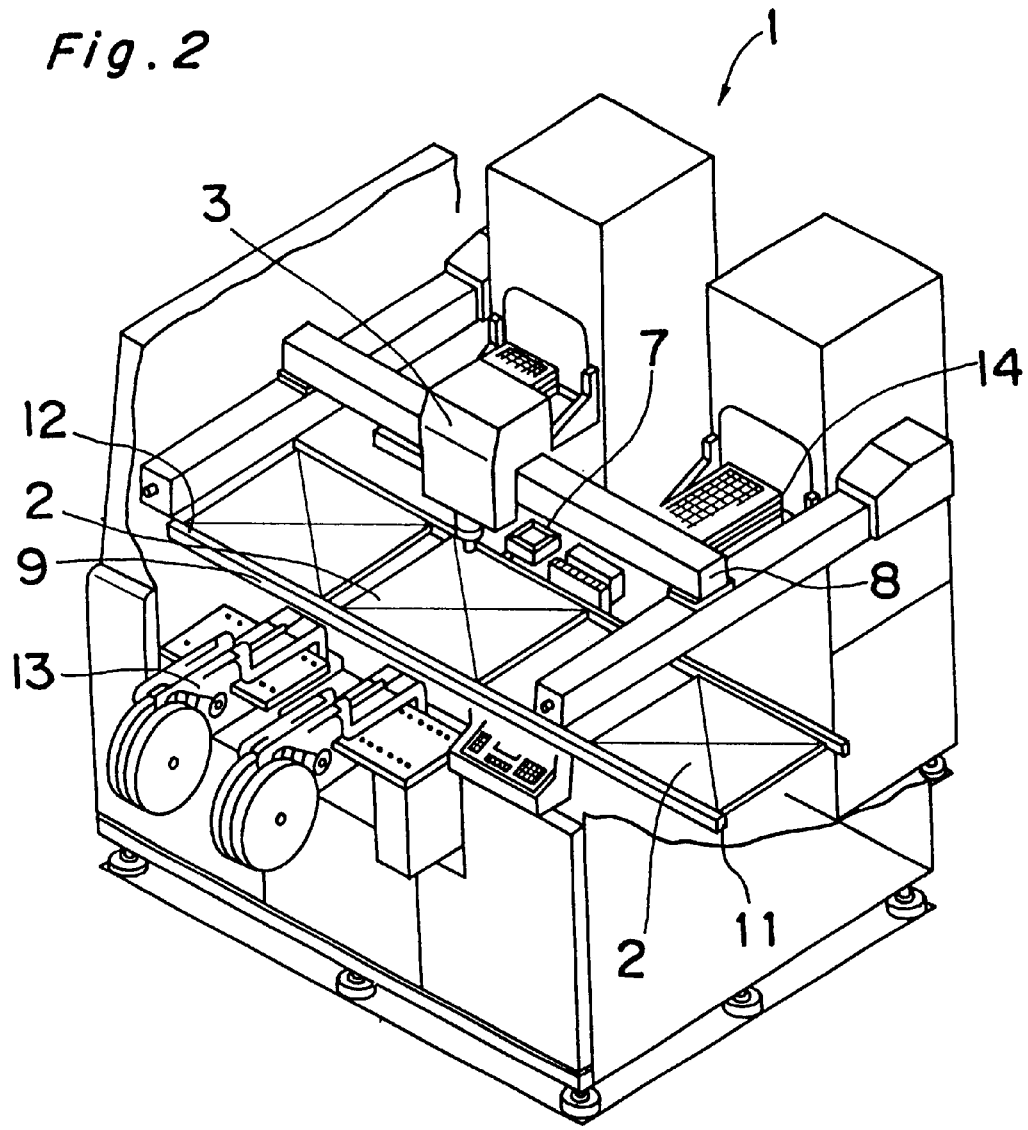
FIG. 2 is a perspective view showing a general arrangement of the component mounting apparatus.

First, the arrangement of a component mounting apparatus according to one embodiment of the present invention is explained with reference to FIGS. 1 and 2. FIGS. 1 and 2 are perspective views showing the arrangement of the component mounting apparatus, where FIG. 2 shows its general arrangement and FIG. 1 shows its partial arrangement.

Referring to FIG. 2, the component mounting apparatus 1 comprises: a board transfer section 9 equipped with a loader 11 for loading a circuit board 2 coming up from a preceding step, to a component mounting position within the apparatus, and with an unloader 12 for carrying out the circuit board 2 having components mounted thereon to a succeeding step; an X-Y robot (serving as an example of the component mounting section) 8 for picking up a component to be mounted from a reel type component feed section 13 and a tray type component feed section 14 and mounting it onto the circuit board 2; and a component recognition camera 7 for taking an image of the suction posture of the component sucked up by a suction nozzle equipped on the X-Y robot 8. Operations of these members are controlled by a controller 500. A main-part arrangement of this component mounting apparatus 1 and its operation are explained below with reference to FIG. 1.

Referring to FIG. 1, a head 3 of the X-Y robot 8 is equipped with nozzle holders 16, 17 for removably loading a suction nozzle 19 that sucks up and holds a component 5, and with a board recognition camera 10 for recognizing the component mounting position. A plurality of suction nozzles 19 suited to suck up a plurality of kinds of components to be mounted onto the circuit board 2 are accommodated at their respective specified positions of a nozzle station 6. Based on control programs of the apparatus, the X-Y robot 8 selects, from the nozzle station 6, suction nozzles 19 suited to suck up the components, and loads the suction nozzles 19 in the nozzle holders 16, 17. A component 5 is sucked up from the component feed section 14 and held by each of the suction nozzles 19. The suction posture of the component 5 is recognized by the component recognition camera 7, and any shift from a reference posture is corrected by rotation of each of the nozzle holders 16, 17. The head 3, to which the component has been sucked up by the suction nozzle 19, is moved to a location above the circuit board 2 held in a main holding section. The head is located above a specified mounting position, where a board mark 18, provided on the circuit board 2, is shot by the board recognition camera 10 so that the mounting position is recognized. Then, based on this recognition data, the component 5 is mounted at the specified position.

In FIG. 1, a box-like article depicted below the head 3 is a component discarding box 4, which is equipped, on its one side, with a transmission sensor (serving as one example of the nozzle identifying device) 20 for deciding the presence or absence of the suction nozzle 19 based on that the optical axis is cut off by the loaded suction nozzle 19 when the nozzle holder 16 or 17 is lowered. Also, each suction nozzle 19 is provided with a nozzle identifying mark 22 such as a bar code that differs from nozzle to nozzle. The identifying mark is recognized by a nozzle identifying sensor (nozzle identifying device) 21.

The controller 500 is connected to the board transfer section 9 with the loader 11 and unloader 12; the reel type component feed section 13; the tray type component feed section 14; the component recognition camera 7; the X-Y robot 8 with the head 3, the board recognition camera 10, the nozzle holders 16, 17; the transmission sensor 20; the nozzle identifying sensor 21; and the compressor 501 to control these operations.

Now the fault preventing operation in the component mounting apparatus 1, constructed as described above is described below with reference to the time chart of FIG. 3 as well as the flow chart of FIG. 4.

Figure 3:
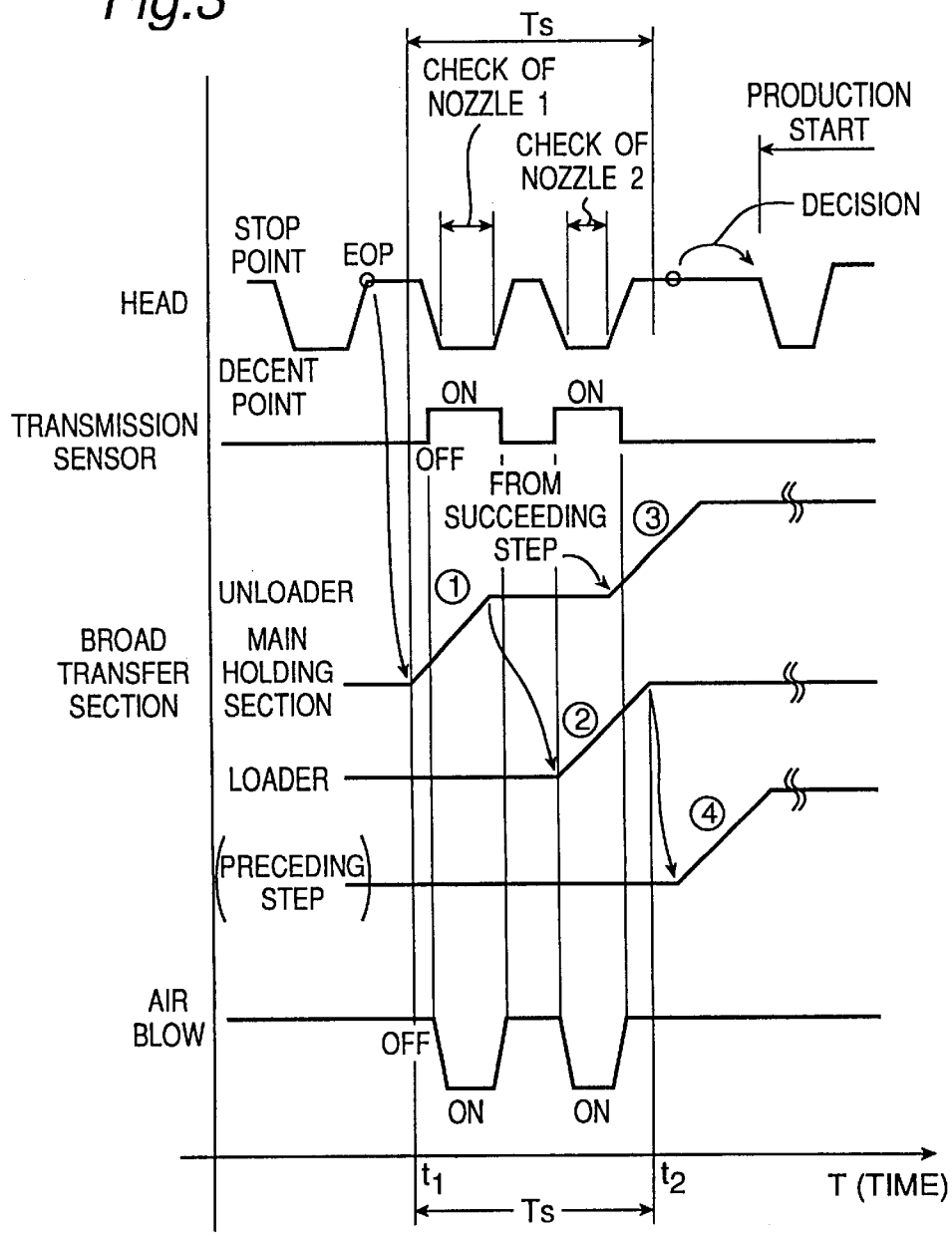
FIG. 3 is a time chart for explaining the operation by the component mounting apparatus.

Referring to FIG. 3, upon receiving a signal EOP (End of Program) representing an end of a mounting process for one circuit board 2, the component mounting apparatus 1 puts the board transfer section 9 into operation, so that the component-mounted circuit board 2 is transferred from the main holding section to the unloader 12 (①in FIG. 3). With the circuit board 2 removed from the main holding section, a circuit board 2, which is to be used for the next mounting process, is carried into the main holding section from the loader 11 (② in FIG. 3). The circuit board 2 that has been transferred to the unloader 12 is carried out in response to a request from the next step (③ in FIG. 3). With no circuit board 2 present on the loader 11, when a circuit board 2 that is over the preceding step is carried into the loader 11, a preparation for the next mounting process is made (④ in FIG. 3).

In the productional operation with the component mounting apparatus 1, as seen above, a wasteful time Ts is needed for the carriage-in and -out of the circuit board 2 before a circuit board 2 for the mounting process comes to be held at the main holding section. By making use of this wasteful time Ts, identification and clearance of the suction nozzles 19 that have been loaded in the head 3 are executed, so that the operation of preventing such faults as mismatch and clogging of the suction nozzle 19 is implemented, which characterizes the component mounting apparatus 1 according to the present embodiment. This operation is explained below with reference to the flow chart of FIG. 4. It is noted that reference characters S1, S2, . . . shown in FIG. 4 are step numbers showing the operating procedure, which are coincident with numbers incorporated in the description herein.

Figure 4:
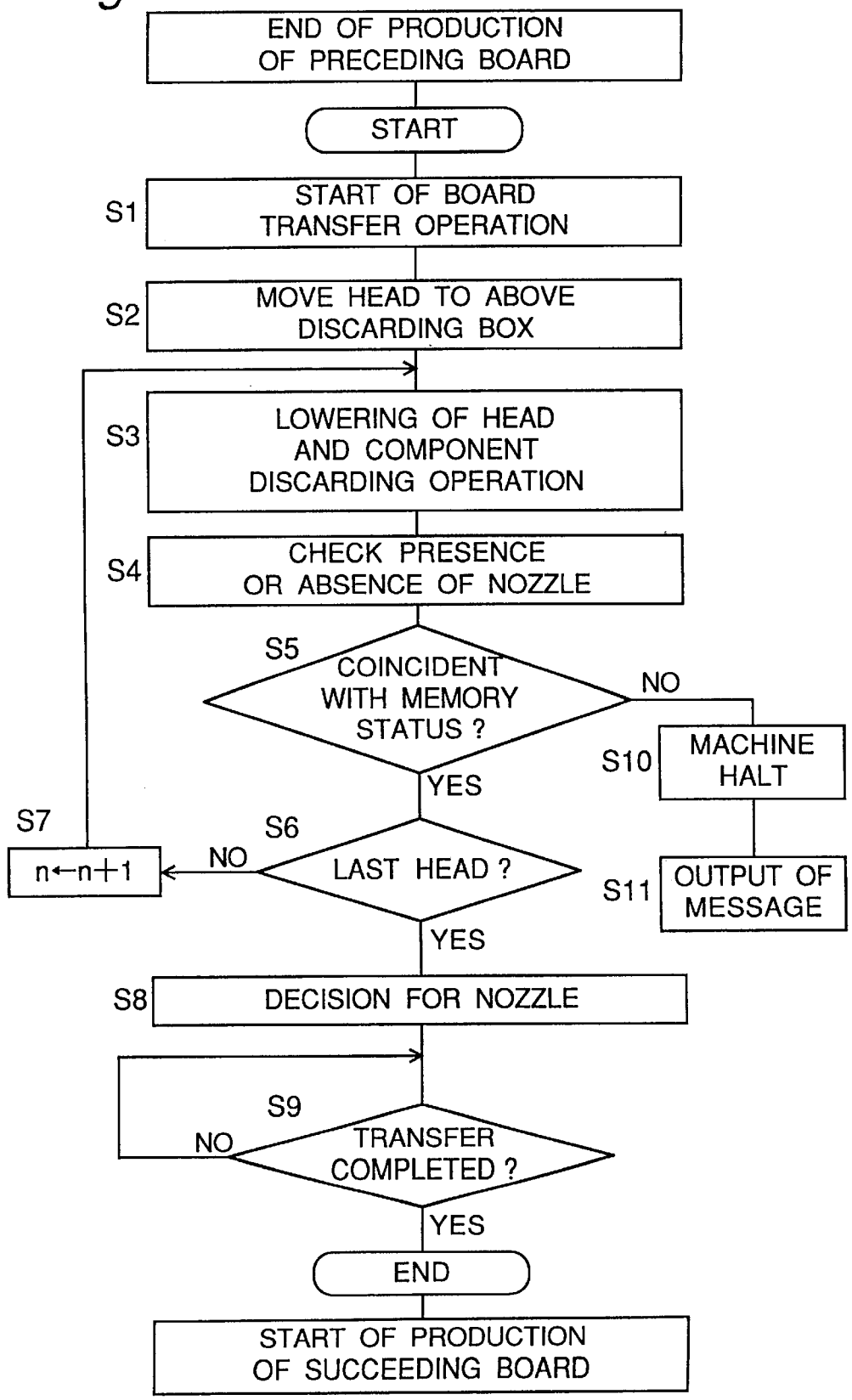
FIG. 4 is a flow chart for explaining the operation by the component mounting apparatus.
Figure 5:
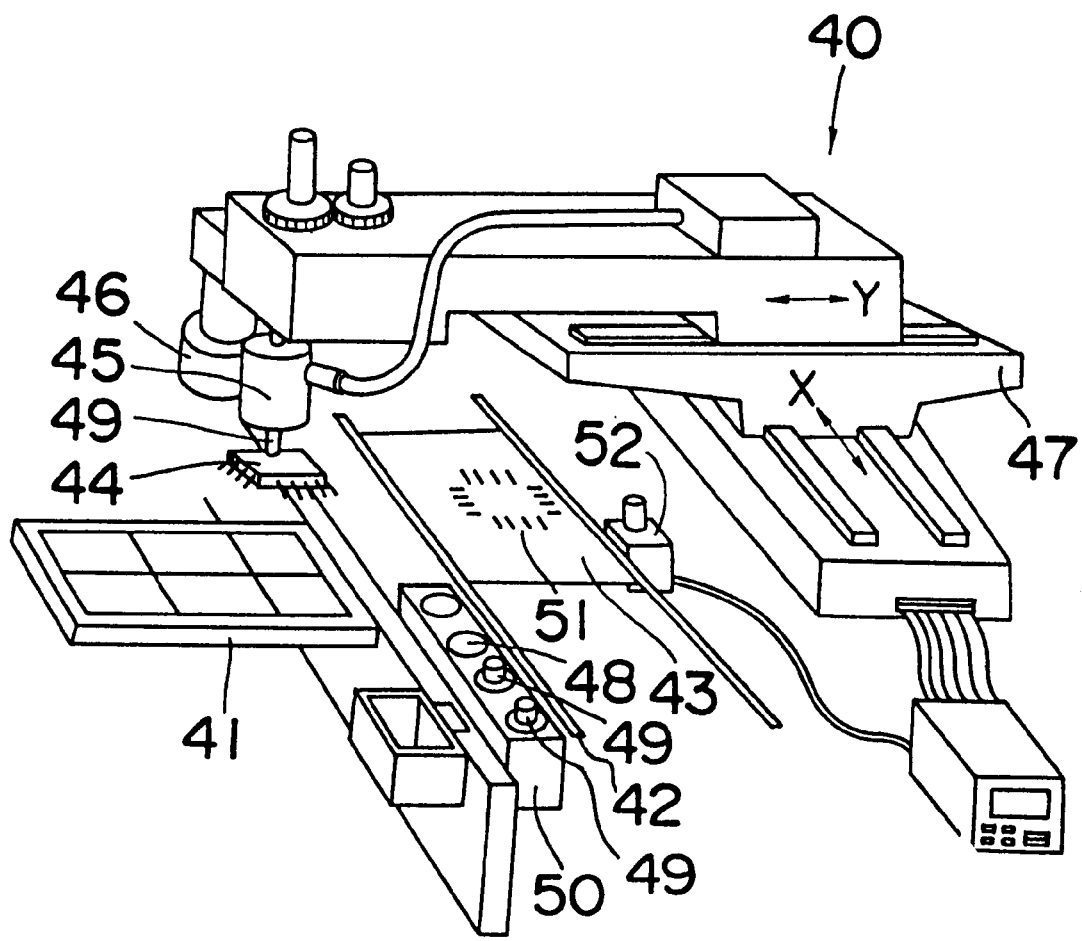
FIG. 5 is a perspective view showing the arrangement of a prior art component mounting apparatus.

Referring to FIG. 4, when the transfer operation of the circuit board 2 is started (S1), the X-Y robot 8 moves the head 3 to above the component discarding box 4 (S2). When the head 3 having the suction nozzles 19 is lowered to a specified descent point, compressed air is fed from a compressor 501 to one of the suction nozzles 19, by which the component 5, if remaining at the suction nozzle 19 due to vacuum residual pressure, is removed while dust and the like sticking to the suction nozzle 19 are removed away simultaneously (S3).

During this operation, the transmission sensor 20 checks whether or not the suction nozzle 19 of the head 3 is present (S4). Also, the nozzle identifying sensor 21 identifies the suction nozzle 19 that has been loaded, by which the matching to the current head controlled by the memory of the controller 500 is checked (S5). As a result of this decision, if a mismatch of the suction nozzle 19 is confirmed, then the operation of the component mounting apparatus 1 is halted (S10), while a message representing the occurrence of a mismatch is outputted (S11). If a match between the loaded suction nozzle 19 and the memory is confirmed, then the exhaust of compressed air is halted, and the head 3 lifts up the suction nozzle 19.

Since the head 3 is equipped with a plurality (n) of suction nozzles 19, the X-Y robot 8 moves the next suction nozzle 19 to a specified position on the component discard box 4, executing the same operations as the steps S3 to S5. This operation of nozzle clearance and decision is repeated until all the n suction nozzles 19 are completely treated (S6 and S7). The X-Y robot 8, after the completion of nozzle decision (S8), moves the head 3 to the nozzle station 6, disconnecting the currently loaded suction nozzle 19 and loading a suction nozzle 19 matching the next-sucked component 5 to the head 3. Now if the transfer of the circuit board 2 to the main holding section by the board transfer section 9 has been completed (S9), the mounting operation of the component mounting apparatus 1 can be started.

The component mounting apparatus 1 according to this embodiment as described above has been so arranged as to be capable of executing all the functions of discarding the component remaining at the suction nozzle 19, detecting the presence or absence of a suction nozzle 19 loaded in the head 3, and determining whether there is a match between the suction nozzle 19 loaded to the head 3 and the control memory. Instead, any of these functions may be adopted singly.

Also, the component mounting apparatus 1 according to this embodiment has been so arranged as to be able to execute the fault preventing operation during the transfer of the circuit board 2. However, the fault preventing operation may also be executed during a period for which the X-Y robot 8 keeps out of the mounting operation of the component 5, including the duration of transfer of the circuit board, for example during a period for which the apparatus operation keeps halted due to the state of the apparatus, misfeeding of components, or the like.

Furthermore, the transmission sensor 20 for detecting the presence or absence of a suction nozzle 19 and the nozzle identifying sensor 21 for making the decision and recognition on the suction nozzle 19 may also be equipped on the head 3 so that a plurality of suction nozzles 19 are moved up and down so as to be checked one after another.

As described above, according to the first and second aspects of the present invention, since the operation of discarding remaining components is executed during the period in which the component mounting operation is halted, a component, even if remaining at the suction nozzle due to vacuum remaining pressure, is removed by the exhaust of compressed air. As a result, any apparatus faults due to remaining components can be prevented from occurring. Also, since the exhaust of compressed air removes dust and the like which are stuck to the suction nozzle, such trouble as suction errors of the suction nozzle can be prevented from occurring, so that a stable apparatus operation can be realized.

According to the third aspect of the present invention, during the period in which the component mounting operation is halted, the presence or absence of a suction nozzle loaded in the head can be detected by moving the suction nozzle to a specified position and moreover the identification of the kind of the suction nozzle loaded in the head can be achieved. Therefore, any errors of the loaded or accommodated position of the suction nozzle due to some error of the operator can be detected so that operating loss or other losses due to apparatus faults can be prevented.

According to the fourth aspect of the present invention, during the operations of discarding the remaining components and removing dust and the like, the checking of the presence or absence of the loaded suction nozzle as well as its identification can be executed simultaneously. Therefore, there can be provided a component mounting apparatus which contributes to stable production free from any operating errors and human errors.

Also, the period in which the component mounting operation is halted can be set to the wasteful time during which the circuit board is transferred. Therefore, the clearance and identification of the suction nozzle can be executed by making effective use of the wasteful time.

The entire disclosure of Japanese Patent Application No. 8-225088 filed on Aug. 27, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:
   a board transfer section for carrying in a circuit board to a component mounting position and carrying out the circuit board after a component-mounting operation;
   a component feed section for feeding a component to be mounted on the circuit board, wherein the component is fed to a specified position;
   a component mounting section for selecting and removably loading a suction nozzle that corresponds to the component to be mounted, sucking up the component from the component feed section, moving the component to the mounting position, and mounting the component at a specified site of the circuit board, wherein the suction nozzle can be selected from among a plurality of suction nozzles;
   a controller for controlling operations of the board transfer section, the component feed section, and the component mounting section in order to execute a production operation of mounting components on the circuit boards; and
   a nozzle identifying device for identifying, during a specified time period in which the component mounting operation at the component mounting section is not being performed, whether or not the suction nozzle has been loaded by the component mounting section.

2. The component-mounting apparatus as claimed in claim 1, wherein the specified time period during which the component mounting operation is not being performed, is the period, after a component mounting operation, that is measured from when the circuit board is carried out from the mounting position until a new circuit board is carried in to the mounting position by the board transfer section.

3. The component-mounting apparatus according to claim 1, wherein the nozzle identifying device is operable to identify a coincidence between the loaded suction nozzle and control data.

4. The component mounting apparatus according to claim 1, wherein the component mounting section is equipped with a nozzle holder for removably loading the suction nozzle that sucks up and holds the component.

5. The component mounting apparatus as claimed in claim 1, further comprising a nozzle station for storing a plurality of suction nozzles corresponding to a plurality of components.

6. A component mounting apparatus comprising:
- a board transfer device for delivering a circuit board to a component mounting position, and removing the circuit board from the component mounting position after a component-mounting operation;
- a component supply section for supplying components to be mounted on the circuit board;
- a nozzle station including a plurality of suction nozzles suitable for sucking up different kinds of components, respectively;
- an X-Y robot including at least one nozzle holder for removably loading and holding a suction nozzle selected from the nozzle station,
  wherein said X-Y robot is capable of selecting and removably loading the suction nozzle that corresponds to the component to be mounted, sucking up the component from said component feed section, moving the component to the mounting position, and mounting the component at a specified site on the circuit board;
- a controller for controlling operations of said board transfer device, said component supply section, and said X-Y robot in order to execute a production operation of mounting components on a plurality of the circuit boards; and
- nozzle identifying means for detecting the presence of the suction nozzle held in the nozzle holder and identifying the kind of suction nozzle held in the nozzle holder, wherein said nozzle identify means is capable of detecting and identifying the nozzle held by the nozzle holder during a specified time period in which the component mounting operation performed by said X-Y robot is not being performed.

7. The mounting apparatus as claimed in claim 6, wherein each of the suction nozzles includes identifying indicia.

8. The component mounting apparatus as claimed in claim 6, wherein each of the suction nozzles is provided with a bar code.

* * * * *

UNITED STATES PATENT AND TRADEMARK OFFICE
CERTIFICATE OF CORRECTION

PATENT NO.    : 6,519,838 B1
DATED         : February 18, 2003
INVENTOR(S)   : Osamu Okuda et al.

It is certified that error appears in the above-identified patent and that said Letters Patent is hereby corrected as shown below:

<u>Title page,</u>
Item [56], References Cited, FOREIGN PATENT DOCUMENTS, delete the last cited reference "JP 11-330 786 * 11/1999".

Signed and Sealed this

Fourth Day of November, 2003

JAMES E. ROGAN
*Director of the United States Patent and Trademark Office*